(12) United States Patent
Slavens et al.

(10) Patent No.: US 11,059,093 B2
(45) Date of Patent: Jul. 13, 2021

(54) ADDITIVELY MANUFACTURED CORE FOR USE IN CASTING AN INTERNAL COOLING CIRCUIT OF A GAS TURBINE ENGINE COMPONENT

(71) Applicant: United Technologies Corporation, Farmington, CT (US)

(72) Inventors: Thomas N. Slavens, Norman, OK (US); James Tilsley Auxier, Bloomfield, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 327 days.

(21) Appl. No.: 16/217,908

(22) Filed: Dec. 12, 2018

(65) Prior Publication Data

US 2019/0118245 A1    Apr. 25, 2019

Related U.S. Application Data

(62) Division of application No. 14/922,273, filed on Oct. 26, 2015, now Pat. No. 10,307,816.

(51) Int. Cl.

| | |
|---|---|
| *B22C 9/10* | (2006.01) |
| *B22F 7/08* | (2006.01) |
| *B33Y 10/00* | (2015.01) |
| *B33Y 80/00* | (2015.01) |
| *B22D 23/06* | (2006.01) |
| *B22D 27/04* | (2006.01) |
| *B22F 5/00* | (2006.01) |

(Continued)

(52) U.S. Cl.
CPC .............. *B22C 9/103* (2013.01); *B22D 23/06* (2013.01); *B22D 27/045* (2013.01); *B22F 5/007* (2013.01); *B22F 7/08* (2013.01); *B22F 10/20* (2021.01); *B33Y 10/00* (2014.12); *B33Y 80/00* (2014.12); *C30B 1/02* (2013.01); *B22F 2999/00* (2013.01); *B28B 1/001* (2013.01); *B28B 7/346* (2013.01); *Y02P 10/25* (2015.11)

(58) Field of Classification Search
CPC ............ B22C 9/103; B22F 7/08; B33Y 10/00
See application file for complete search history.

(56) References Cited

U.S. PATENT DOCUMENTS

| | | |
|---|---|---|
| 5,599,166 A | 2/1997 | Deptowicz et al. |
| 8,157,504 B2 | 4/2012 | Amaral et al. |

(Continued)

FOREIGN PATENT DOCUMENTS

| | | |
|---|---|---|
| EP | 1616642 A1 | 1/2006 |
| WO | 2013163029 A1 | 10/2013 |

(Continued)

OTHER PUBLICATIONS

European Office Action dated Mar. 26, 2019, issued in the corresponding European Patent Application No. 16195466.4.

(Continued)

*Primary Examiner* — James Sanders
(74) *Attorney, Agent, or Firm* — Bachman & LaPointe, P.C.

(57) ABSTRACT

A core for use in casting an internal cooling circuit within a gas turbine engine component includes a base core portion and an additive core portion additively manufactured to the base core portion. A method of manufacturing a core for use in casting an internal cooling circuit within a gas turbine engine component including additively manufacturing an additive core portion to a base core portion.

8 Claims, 7 Drawing Sheets

(51) Int. Cl.
  *B22F 10/20*   (2021.01)
  *C30B 1/02*    (2006.01)
  *B28B 1/00*    (2006.01)
  *B28B 7/34*    (2006.01)

(56) References Cited

U.S. PATENT DOCUMENTS

| | | |
|---|---|---|
| 8,261,810 B1    | 9/2012  | Liang |
| 2003/0223862 A1 | 12/2003 | Demarche et al. |
| 2004/0076519 A1 | 4/2004  | Halfmann et al. |
| 2004/0115053 A1 | 6/2004  | Shi et al. |
| 2007/0128032 A1 | 6/2007  | Lee et al. |
| 2007/0237639 A1 | 10/2007 | Cunha et al. |
| 2008/0056908 A1 | 3/2008  | Morris et al. |
| 2008/0101961 A1 | 5/2008  | Liang et al. |
| 2008/0138209 A1 | 6/2008  | Cunha et al. |
| 2008/0164001 A1 | 7/2008  | Morris et al. |
| 2009/0317234 A1 | 12/2009 | Zausner et al. |
| 2010/0008761 A1 | 1/2010  | Piggush et al. |
| 2012/0269649 A1 | 10/2012 | Rawlings et al. |

FOREIGN PATENT DOCUMENTS

| | | |
|---|---|---|
| WO | 2014011262 A2 | 1/2014 |
| WO | 2014165337 A1 | 10/2014 |
| WO | 2015050987 A1 | 4/2015 |
| WO | 2015073202 A1 | 5/2015 |
| WO | 2015112885 A1 | 7/2015 |

OTHER PUBLICATIONS

Tavares, Luis M. et al.: "Comparison of Measures of Rock Crushability"; in "Fine Particle Technology and Characterization", Jun. 1, 2018; Research Signpost, Kerala, India, XP055571163, ISBN: 978-81-30-80241-1, vol. 37661, pp. 1-20.

ADDITIVELY MANUFACTURED CORE FOR USE IN CASTING AN INTERNAL COOLING CIRCUIT OF A GAS TURBINE ENGINE COMPONENT

CROSS-REFERENCE TO RELATED APPLICATION

The instant application is a divisional application of U.S. patent application Ser. No. 14/922,273 filed Oct. 26, 2015.

BACKGROUND

The present disclosure relates to additive manufacturing and, more particularly, to a core with an additively manufactured portion for use in casting an internal cooling circuit within a gas turbine engine component.

Gas turbine engines typically include a compressor section to pressurize airflow, a combustor section to burn a hydrocarbon fuel in the presence of the pressurized air, and a turbine section to extract energy from the resultant combustion gases. Gas path components, such as turbine blades, often include airfoil cooling that may be accomplished by external film cooling, internal air impingement and forced convection either separately or in combination.

Advances in casting facilitate significantly smaller and more complex passages to accommodate elevated temperatures with a reduced flow of cooling air, yet relatively small features remain difficult, if not impossible, to cast via a conventional core casting process in an efficient and repeatable manner.

SUMMARY

A core for use in casting an internal cooling circuit within a gas turbine engine component according to one disclosed non-limiting embodiment of the present disclosure can include a base core portion; and an additive core portion additively manufactured to the base core portion.

A further embodiment of the present disclosure may include, wherein the base core portion is manufactured of a first material and the additive core portion is manufactured of a second material, the first material different than the second material.

A further embodiment of any of the embodiments of the present disclosure may include, wherein the base core portion is manufactured of a ceramic material.

A further embodiment of any of the embodiments of the present disclosure may include, wherein the base core portion is cast.

A further embodiment of any of the embodiments of the present disclosure may include, wherein the additive core portion is additively manufactured of molybdenum.

A further embodiment of any of the embodiments of the present disclosure may include, wherein the additive core portion forms a multiple of trailing edge crossovers.

A further embodiment of any of the embodiments of the present disclosure may include, wherein the additive core portion is additively manufactured onto the base core portion.

A further embodiment of any of the embodiments of the present disclosure may include, wherein the additive core portion includes a multiple of pin-shaped protrusions.

A further embodiment of any of the embodiments of the present disclosure may include, wherein each of the multiple of pin-shaped protrusions are additively manufactured into a respective recess formed in the base core portion.

A further embodiment of any of the embodiments of the present disclosure may include, wherein the base core portion is more crushable than the additive core portion.

A method of manufacturing a core for use in casting an internal cooling circuit within a gas turbine engine component, the method according to another disclosed non-limiting embodiment of the present disclosure can include additively manufacturing an additive core portion to a base core portion.

A further embodiment of any of the embodiments of the present disclosure may include casting the base core portion.

A further embodiment of any of the embodiments of the present disclosure may include casting the base core portion of a first material and additively manufacturing the additive core portion of a second material, the first material different than the second material.

A further embodiment of any of the embodiments of the present disclosure may include forming the additive core portion to form a multiple of trailing edge crossovers.

A further embodiment of any of the embodiments of the present disclosure may include additively manufacturing the additive core portion to form a multiple of pin-shaped protrusions.

A further embodiment of any of the embodiments of the present disclosure may include forming the additive core portion onto the base core portion.

A further embodiment of any of the embodiments of the present disclosure may include firing the additive core portion and the base core portion.

A further embodiment of any of the embodiments of the present disclosure may include additively manufacturing the additive core portion to form a trailing edge portion of the core.

A further embodiment of any of the embodiments of the present disclosure may include positioning the core within a shell.

A further embodiment of any of the embodiments of the present disclosure may include, wherein the additive core portion at least partially contacts the shell.

The foregoing features and elements may be combined in various combinations without exclusivity, unless expressly indicated otherwise. These features and elements as well as the operation thereof will become more apparent in light of the following description and the accompanying drawings. It should be understood, however, the following description and drawings are intended to be exemplary in nature and non-limiting.

BRIEF DESCRIPTION OF THE DRAWINGS

Various features will become apparent to those skilled in the art from the following detailed description of the disclosed non-limiting embodiments. The drawings that accompany the detailed description can be briefly described as follows.

DETAILED DESCRIPTION

Figure 1:
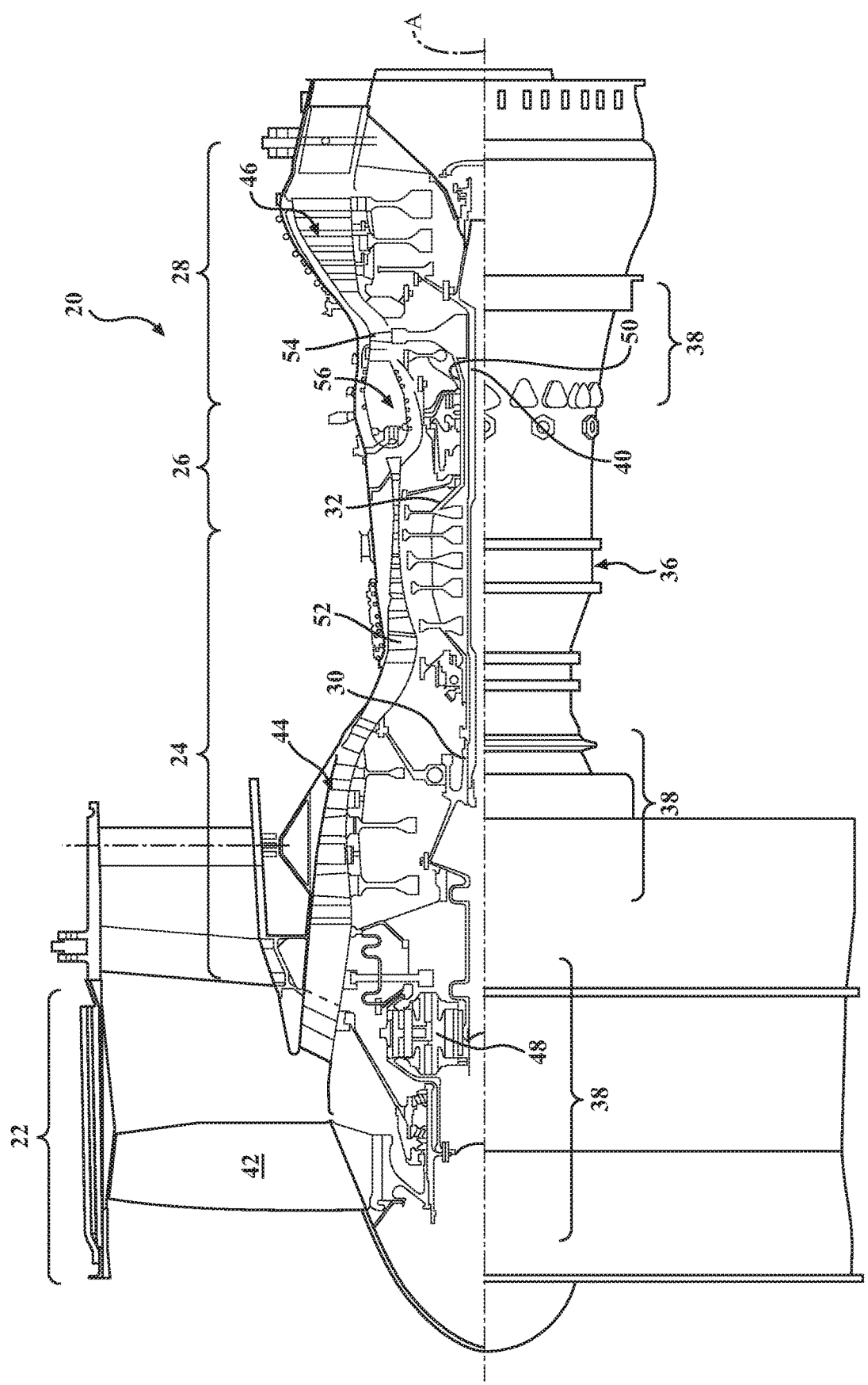
FIG. 1 is a schematic cross-section of an example gas turbine engine architecture.

FIG. 1 schematically illustrates a gas turbine engine 20. The gas turbine engine 20 is disclosed herein as a two-spool turbo fan that generally incorporates a fan section 22, a compressor section 24, a combustor section 26 and a turbine section 28. The fan section 22 drives air along a bypass flowpath while the compressor section 24 drives air along a core flowpath for compression and communication into the combustor section 26 then expansion through the turbine section 28. Although depicted as a turbofan in the disclosed non-limiting embodiment, it should be understood that the concepts described herein are not limited to use with turbofans as the teachings may be applied to other types of turbine engine architectures such as turbojets, turboshafts, and three-spool (plus fan) turbofans.

The engine 20 generally includes a low spool 30 and a high spool 32 mounted for rotation about an engine central longitudinal axis X relative to an engine static structure 36 via several bearing structures 38. The low spool 30 generally includes an inner shaft 40 that interconnects a fan 42, a low pressure compressor ("LPC") 44 and a low pressure turbine ("LPT") 46. The inner shaft 40 drives the fan 42 directly or through a geared architecture 48 to drive the fan 42 at a lower speed than the low spool 30. An exemplary reduction transmission is an epicyclic transmission, namely a planetary or star gear system.

The high spool 32 includes an outer shaft 50 that interconnects a high pressure compressor ("HPC") 52 and high pressure turbine ("HPT") 54. A combustor 56 is arranged between the high pressure compressor 52 and the high pressure turbine 54. The inner shaft 40 and the outer shaft 50 are concentric and rotate about the engine central longitudinal axis X which is collinear with their longitudinal axes.

Core airflow is compressed by the LPC 44 then the HPC 52, mixed with the fuel and burned in the combustor 56, then expanded over the HPT 54 and the LPT 46. The turbines 54, 46 rotationally drive the respective low spool 30 and high spool 32 in response to the expansion. The main engine shafts 40, 50 are supported at a plurality of points by bearing structures 38 within the static structure 36. It should be understood that various bearing structures 38 at various locations may alternatively or additionally be provided.

Figure 2:
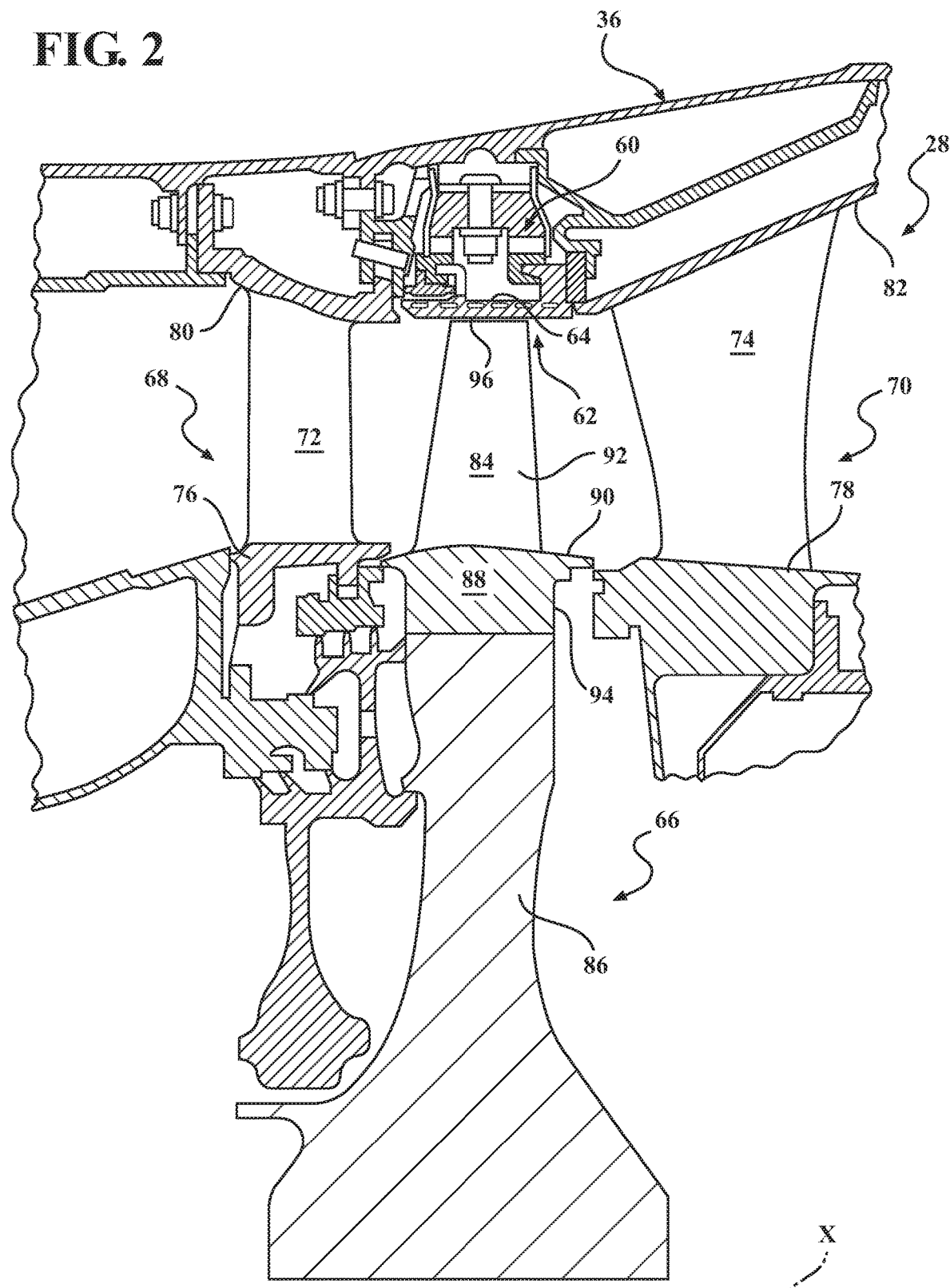
FIG. 2 is an enlarged schematic cross-section of an engine turbine section.

With reference to FIG. 2, an enlarged schematic view of a portion of the turbine section 28 is shown by way of example; however, other engine sections will also benefit herefrom. A full ring shroud assembly 60 within the engine case structure 36 supports a blade outer air seal (BOAS) assembly 62 with a multiple of circumferentially distributed BOAS 64 proximate to a rotor assembly 66 (one schematically shown).

The full ring shroud assembly 60 and the BOAS assembly 62 are axially disposed between a forward stationary vane ring 68 and an aft stationary vane ring 70. Each vane ring 68, 70 includes an array of vanes 72, 74 that extend between a respective inner vane platform 76, 78 and an outer vane platform 80, 82. The outer vane platforms 80, 82 are attached to the engine case structure 36.

The rotor assembly 66 includes an array of blades 84 circumferentially disposed around a disk 86. Each blade 84 includes a root 88, a platform 90 and an airfoil 92 (also shown in FIG. 3). The blade roots 88 are received within a rim 94 of the disk 86 and the airfoils 92 extend radially outward such that a tip 96 of each airfoil 92 is closest to the blade outer air seal (BOAS) assembly 62. The platform 90 separates a gas path side inclusive of the airfoil 92 and a non-gas path side inclusive of the root 88.

Figure 3:
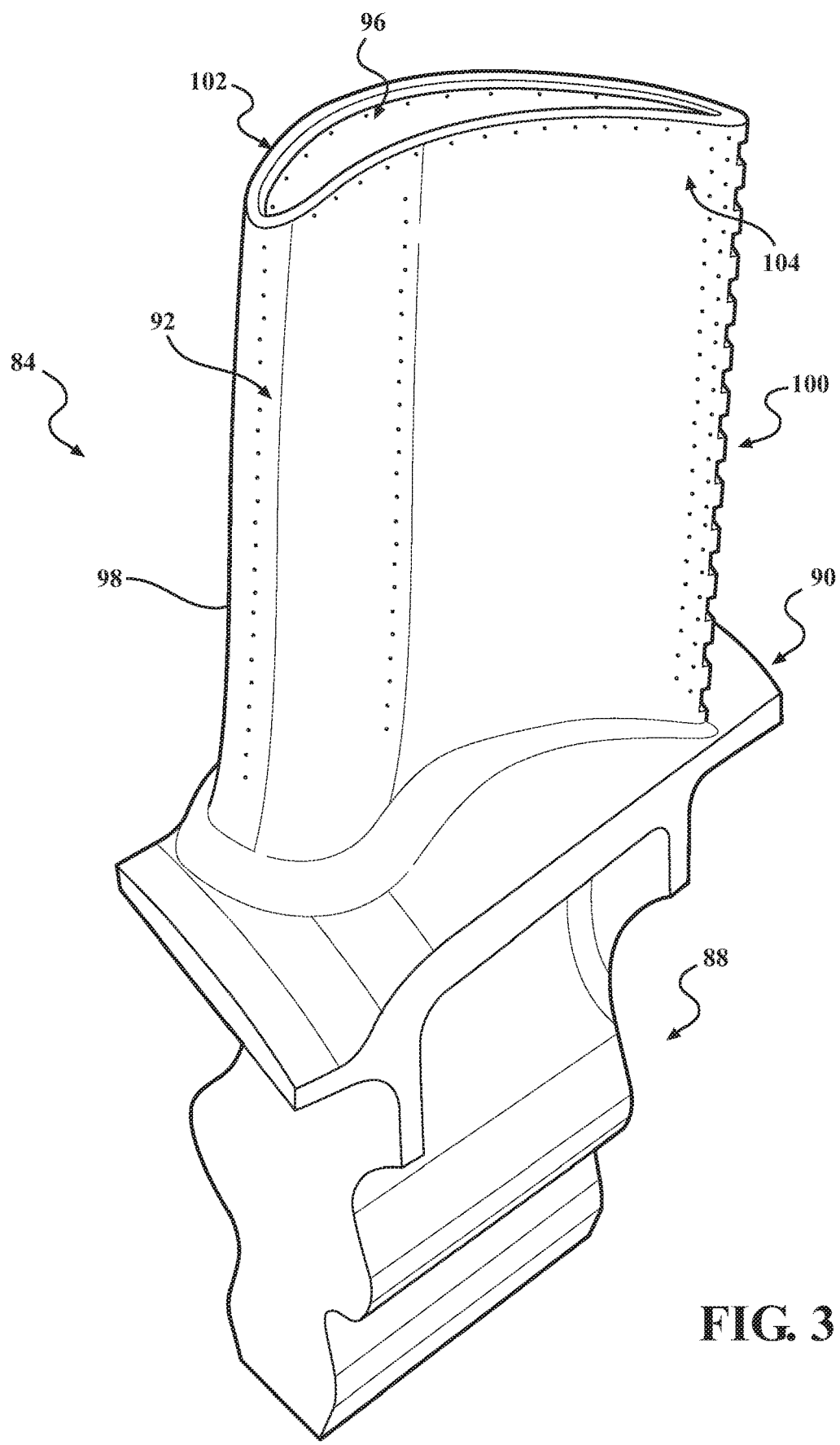
FIG. 3 is a perspective view of an airfoil as an example component.

With reference to FIG. 3, the platform 90 generally separates the root 88 and the airfoil 92 to define an inner boundary of a gas path. The airfoil 92 defines a blade chord between a leading edge 98, which may include various forward and/or aft sweep configurations, and a trailing edge 100. A first sidewall 102 that may be convex to define a suction side, and a second sidewall 104 that may be concave to define a pressure side are joined at the leading edge 98 and at the axially spaced trailing edge 100. The tip 96 extends between the sidewalls 102, 104 opposite the platform 90. It should be appreciated that the tip 96 may include a recessed portion.

Figure 4:
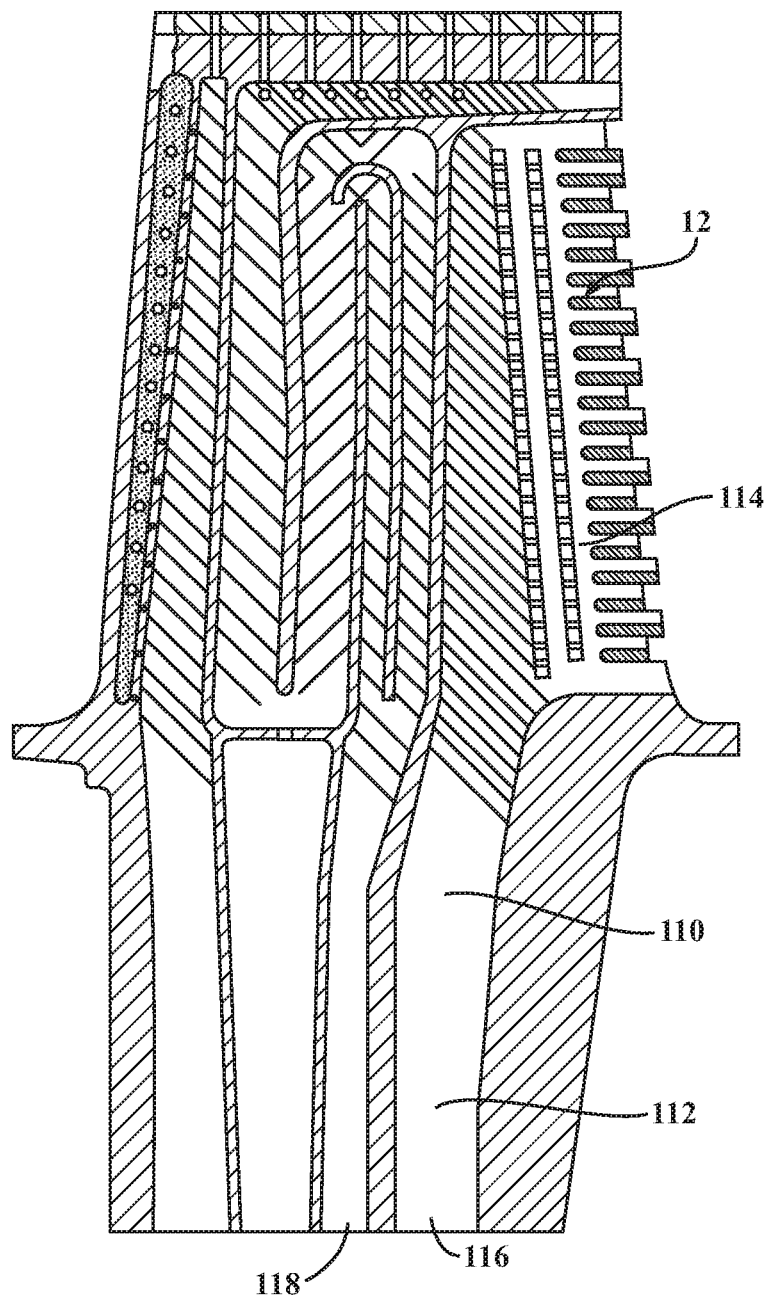
FIG. 4 is a schematic cross-section view of the airfoil of FIG. 4 showing the internal architecture.

To resist the high temperature stress environment in the gas path of a turbine engine, each blade 84 may be formed by casting. It should be appreciated that although a blade 84 with an internal cooling circuit 110 (shown schematically; FIG. 4) will be described and illustrated in detail, other hot section components including, but not limited to, vanes, turbine shrouds, end walls, and other such components will also benefit here from.

With reference to FIG. 4, the internal cooling circuit 110 may include a feed passage 112 that communicates airflow into a trailing edge cavity 114 within the airfoil 92. It should be appreciated that the internal cooling circuit 110 may be of various geometries, and include various features. The feed passage 112 in this embodiment is the aft most passage that communicates cooling air to the trailing edge cavity 114. The feed passage 112 generally receives cooling flow through at least one inlet 116 within the base 118 of the root 88. It should be appreciated that various feed architecture; cavities, and passageway arrangements will benefit herefrom.

The tip 96 and the trailing edge 100 bound the trailing edge cavity 114 between the sidewalls 102, 104. The trailing edge cavity 114 includes a multiple of features 120. The features 120 in this disclosed non-limiting embodiment may include a multiple of pedestals 122, a multiple of strips 124, and a multiple of edge features 126. It should be appreciated that although particular features are delineated within certain general areas, the features may be otherwise arranged or intermingled and still not depart from the disclosure herein.

The pedestals 122 may be staggered and be of one or more shapes such as circular, rectilinear, diamond and others. The pedestals 122 generate turbulence in the cooling airflow and hence advantageously increases heat pick-up. The strip features 124 form a multiple of respective trailing edge crossovers 160. The trailing edge crossovers 160 extend to the trailing edge 100. The edge features 126 define trailing edge exits 162 through the trailing edge 100 such that the trailing edge 100 may be essentially discontinuous.

Figure 5:
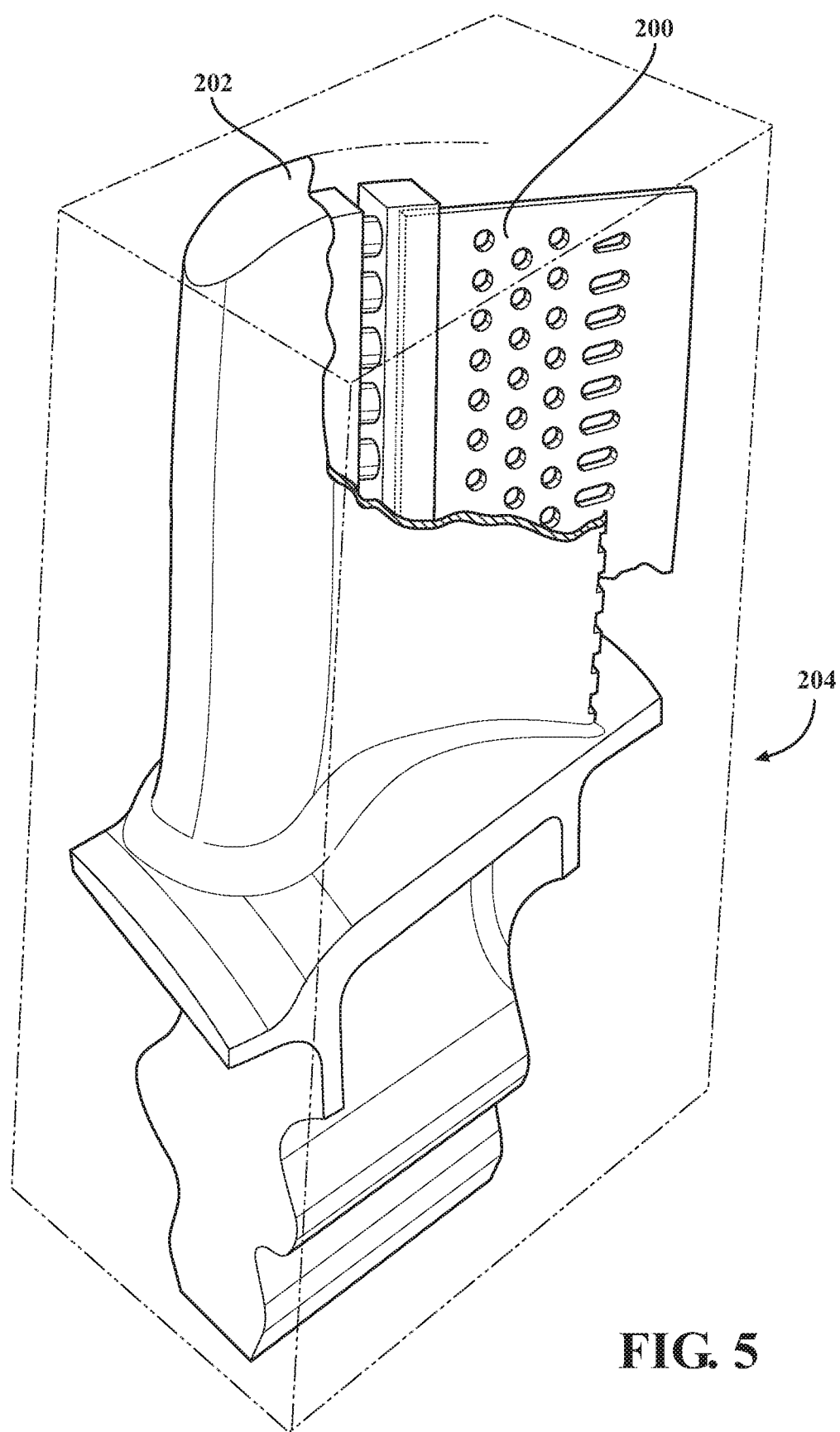
FIG. 5 is a schematic partial fragmentary view of a mold with ceramic core that is additively manufactured according to another disclosed process for casting of an airfoil.

Generally, to form the internal cooling circuit 110, a core 200 is positioned within a shell 202 (FIG. 5). The shell 202 defines the outer surface of the blade 84 while the core 200 forms the internal surfaces such as that which defines the internal cooling circuit 110 (FIG. 4). That is, during the casting process, the core 200 fills a selected volume within the shell 202 that, when removed from the finished blade casting, defines the internal cooling circuit 110 utilized for cooling airflow.

The shell 202 and the core 200 together define a mold 204 to cast the complex exterior and interior geometries that may be formed of refractory metals, ceramic, or hybrids thereof. The mold 204 operates as a melting unit and/or a die for a desired material that forms the blade 84. The desired material may include but not be limited to a super alloy or other material such as nickel based super alloy, cobalt based super alloy, iron based super alloy, and mixtures thereof that is melted; a molten super alloy that is then solidified; or other material. In another non-limiting embodiment, the crucible may be directly filled with a molten super alloy.

Alternatively, or in addition, a single crystal starter seed or grain selector may be utilized to enable a single crystal to form when solidifying the component. The solidification may utilize a chill block in a directional solidification furnace. The directional solidification furnace has a hot zone that may be induction heated and a cold zone separated by an isolation valve. The chill block may be elevated into the hot zone and filled with molten super alloy. After the pour, or being molten, the chill plate may descend into the cold chamber causing a solid/liquid interface to advance from the partially molten starter seed in the form of a single crystallographic oriented component whose orientation is dictated by the orientation of the starter seed. Casting is typically performed under an inert atmosphere or vacuum to preserve the purity of the casting.

Following solidification, the shell 202 may be broken away and the core 200 may be removed from the solidified component by, for example, caustic leaching, to leave the finished single crystal component. After removal, machining, surface treating, coating, or any other desirable finishing operation may be performed to further finish the component.

Figure 6:
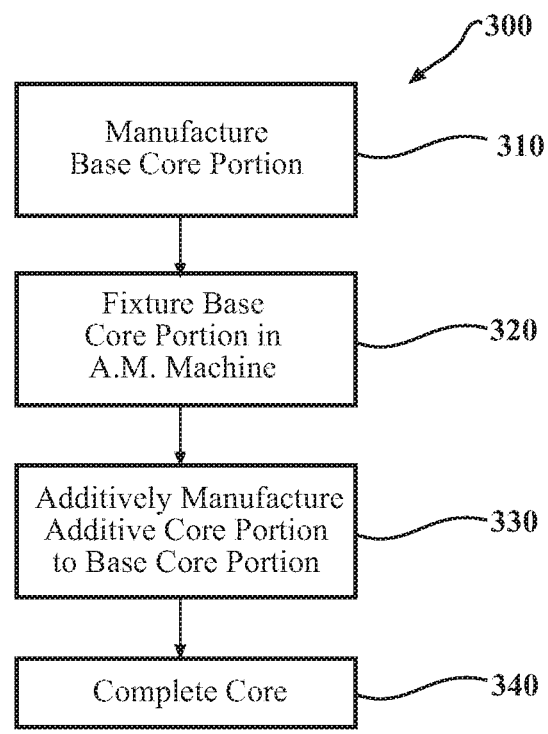
FIG. 6 is a method to at least partially additively manufacture a core according to one disclosed non-limiting embodiment.
Figure 7:
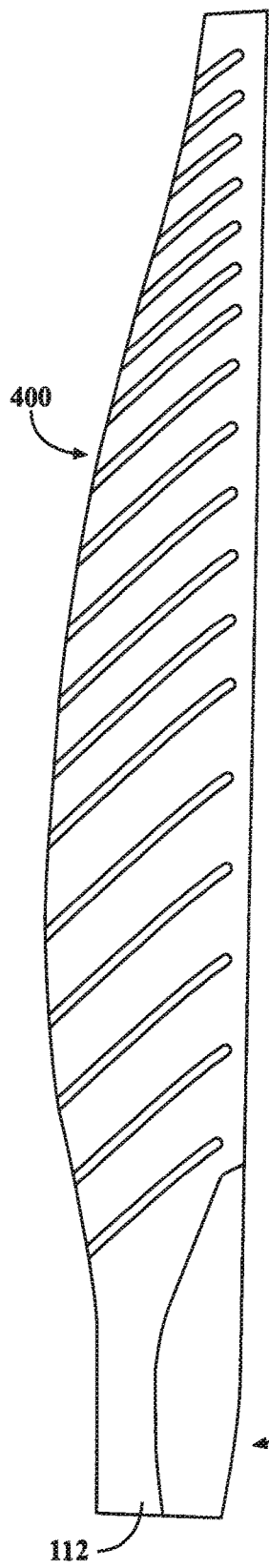
FIG. 7 is a perspective view of a portion of a core.

With reference to FIG. 6, one disclosed non-limiting embodiment of a method 300 to manufacture the core 200 initially includes manufacturing a base core portion 400 such as via injected or transfer molding with optional finishing steps (step 310; FIGS. 6 and 7). That is, the base core portion 400 may be a semi-finished conventionally manufactured ceramic core that is first manufactured. As one or more features are to be additively manufactured, the base core portion 400 may be relatively less complicated and need only be utilized to, for example, produce the relatively more coarse features of the internal cooling circuit 110.

Next, the base core portion 400 is fixtured into a bed of an additive manufacturing machine (step 320). The shape of the base core portion 400 is accounted for in the programming of the additive manufacturing machine. That is, the programming is utilized to facilitate usage of the base core portion 400 as a reference for the additive manufacturing machine. It should be appreciated that in some embodiments, additive manufacturing may be performed on one location of the base core portion 400, then the base core portion 400 is fixtured in another orientation to perform additive manufacturing on another location of the base core portion 400.

Figure 8:
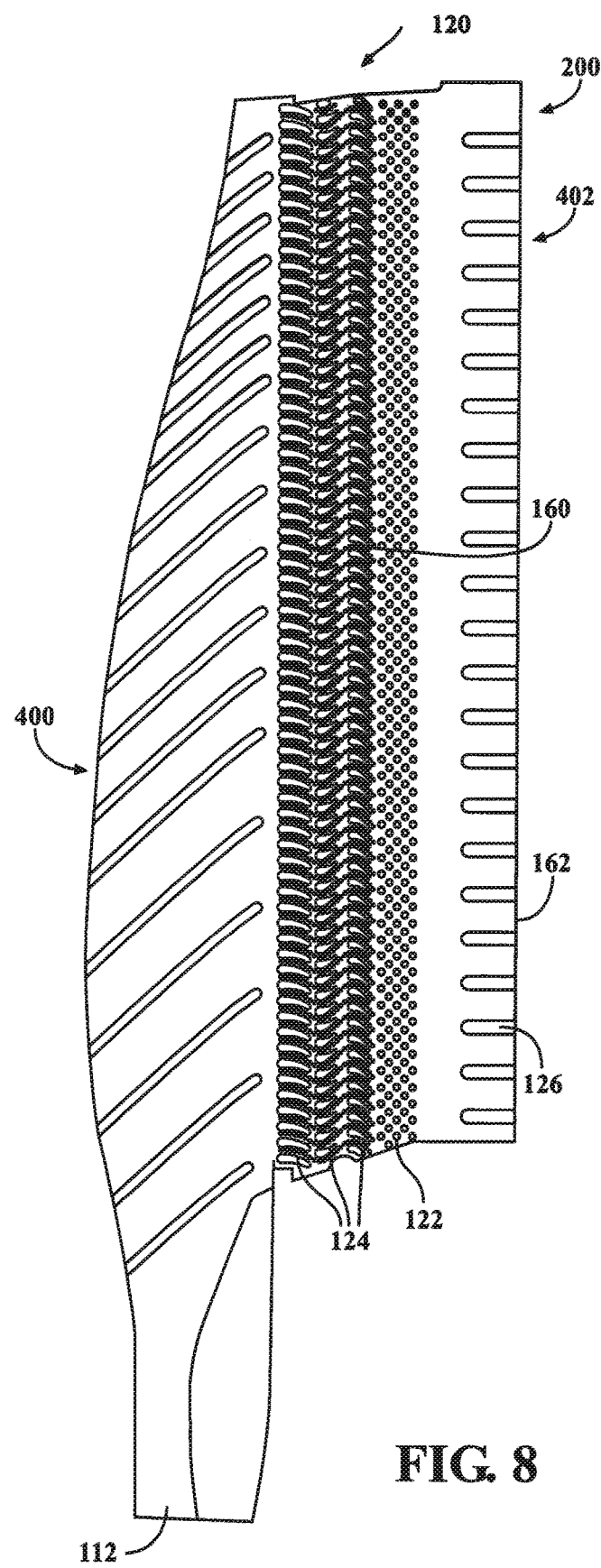
FIG. 8 is a perspective view of a core with an additively manufactured portion.

Next, an additive material fills the bed, and ceramic printing commences upon or adjacent to the base core portion 400 to form an additive core portion 402 that is additively manufactured to the base core portion 400 (step 330; FIGS. 6 and 8).

The additive core portion 402 may be readily manufactured with an additive manufacturing process that includes but are not limited to, Sterolithography (SLA), Direct Selective Laser Sintering (DSLS), Electron Beam Sintering (EBS), Electron Beam Melting (EBM), Laser Engineered Net Shaping (LENS), Laser Net Shape Manufacturing (LNSM), Direct Metal Deposition (DMD), Laser Powder Bed Fusion (LPBF) and others. Although particular additive manufacturing processes are disclosed, those skilled in the art of manufacturing will recognize that any other suitable rapid manufacturing methods using layer-by-layer construction or additive fabrication can alternatively be used.

The additive material for the additive core portion 402 may be a material different than that of the base core portion 400. For example, the base core portion 400 may be manufactured of silica, refractory metal, alumina ceramic, or other such material, whereas the additive material may include molybdenum or other relatively more resilient material. That is, the base core portion 400 is manufactured of a relatively crushable material, while the additive core portion 402 may be manufactured of a relatively less crushable material to facilitate definition of the relatively fine portions of the internal cooling circuit 110. For instance, the base core portion 400 may be produced without trailing edge features, which are later completed as the additive core portion 402. It should be appreciated that various and/or multiple additive core portions 402 may be formed.

Finally, the base core portion 400 and the additive core portion 402 are then fired to complete the core 200 (step 340). That is, the base core portion 400 and the additive core portion 402 are prepared for final disposition of the core 200 within the shell 202

Figure 9:
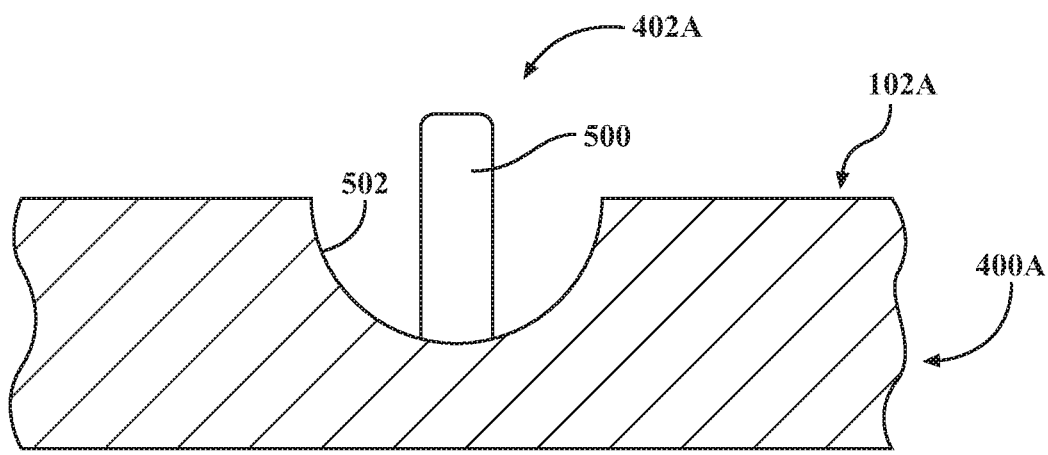
FIG. 9 is an expanded sectional view of an additively manufactured core feature features according to another disclosed non-limiting embodiment.

With reference to FIG. 9, in another disclosed non-limiting embodiment, the additive core portion 402A may include a multiple of pin-shaped protrusions 500 that are additively manufactured into a respective recess 502 formed in the base core portion 400A (one shown). The protrusions 500 are operable to form cooling apertures that extend into a bump on an internal surface of the airfoil wall to, for example, provide an internal feature to facilitate heat transfer. It should be appreciated that such high fidelity features may not be otherwise manufactured with conventional cast cores.

The additive core portion 402 readily facilities manufacture of relatively small features that are difficult if not impossible to produce via a conventional core casting process in an efficient repeatable manner.

The use of the terms "a," "an," "the," and similar references in the context of description (especially in the context of the following claims) are to be construed to cover both the singular and the plural, unless otherwise indicated herein or specifically contradicted by context. The modifier "about" used in connection with a quantity is inclusive of the stated value and has the meaning dictated by the context (e.g., it includes the degree of error associated with measurement of the particular quantity). All ranges disclosed herein are inclusive of the endpoints, and the endpoints are independently combinable with each other. It should be appreciated that relative positional terms such as "forward," "aft," "upper," "lower," "above," "below," and the like are with reference to normal operational attitude and should not be considered otherwise limiting.

Although the different non-limiting embodiments have specific illustrated components, the embodiments of this invention are not limited to those particular combinations. It is possible to use some of the components or features from any of the non-limiting embodiments in combination with features or components from any of the other non-limiting embodiments.

It should be appreciated that like reference numerals identify corresponding or similar elements throughout the several drawings. It should also be appreciated that although a particular component arrangement is disclosed in the illustrated embodiment, other arrangements will benefit herefrom.

Although particular step sequences are shown, described, and claimed, it should be understood that steps may be performed in any order, separated or combined unless otherwise indicated and will still benefit from the present disclosure.

The foregoing description is exemplary rather than defined by the limitations within. Various non-limiting embodiments are disclosed herein, however, one of ordinary skill in the art would recognize that various modifications and variations in light of the above teachings will fall within the scope of the appended claims. It is therefore to be understood that within the scope of the appended claims, the disclosure may be practiced other than as specifically described. For that reason the appended claims should be studied to determine true scope and content.

What is claimed:

1. A method of manufacturing a core for use in casting an internal cooling circuit within a gas turbine engine component, the method comprising:

manufacturing a base core portion of a first crushable material without at least one portion of the internal cooling circuit; and additively manufacturing an additive core portion to the base core portion, the additive core portion comprising the at least one portion of the internal cooling circuit of the core to form a complete internal cooling circuit, the additive core portion manufactured of a second crushable material, the second crushable material less crushable than the first crushable material.

2. The method as recited in claim 1, further comprising casting the base core portion.

3. The method as recited in claim 1, further comprising forming the additive core portion to form a multiple of trailing edge crossovers.

4. The method as recited in claim 1, further comprising additively manufacturing the additive core portion to form a multiple of pin-shaped protrusions.

5. The method as recited in claim 1, further comprising firing the additive core portion and the base core portion.

6. The method as recited in claim 1, further comprising additively manufacturing the additive core portion to form a trailing edge portion of the core.

7. The method as recited in claim 1, further comprising positioning the core within a shell.

8. The method as recited in claim 7, wherein the additive core portion at least partially contacts the shell.

* * * * *